United States Patent
Ebner et al.

(10) Patent No.: US 12,281,407 B2
(45) Date of Patent: Apr. 22, 2025

(54) DEVICE FOR PRODUCING SILICON CARBIDE SINGLE CRYSTALS

(71) Applicant: EBNER Industrieofenbau GmbH, Leonding (AT)

(72) Inventors: Robert Ebner, Leonding (AT); Kanaparin Ariyawong, Leonding (AT); Ghassan Barbar, Neunkirchen (DE); Chih-Yung Hsiung, Leonding (AT)

(73) Assignee: EBNER Industrieofenbau GmbH, Leonding (AT)

( * ) Notice: Subject to any disclaimer, the term of this patent is extended or adjusted under 35 U.S.C. 154(b) by 276 days.

(21) Appl. No.: 18/028,682

(22) PCT Filed: Sep. 23, 2021

(86) PCT No.: PCT/AT2021/060341
§ 371 (c)(1),
(2) Date: Mar. 27, 2023

(87) PCT Pub. No.: WO2022/061386
PCT Pub. Date: Mar. 31, 2022

(65) Prior Publication Data
US 2023/0332327 A1    Oct. 19, 2023

(30) Foreign Application Priority Data
Sep. 28, 2020   (AT) .............. A 50819/2020

(51) Int. Cl.
C30B 23/02     (2006.01)
C30B 23/06     (2006.01)
C30B 29/36     (2006.01)

(52) U.S. Cl.
CPC ............ *C30B 23/066* (2013.01); *C30B 29/36* (2013.01)

(58) Field of Classification Search
CPC .......................... C30B 23/066; C30B 29/36
See application file for complete search history.

(56) References Cited

U.S. PATENT DOCUMENTS

| | | | |
|---|---|---|---|
| 4,578,146 A | 3/1986 | Chai et al. | |
| 6,048,398 A | 4/2000 | Vehanen et al. | |
| 6,723,166 B2 | 4/2004 | Kuhn et al. | |
| 6,780,243 B1 | 8/2004 | Wang et al. | |

(Continued)

FOREIGN PATENT DOCUMENTS

| CN | 101003914 A | 7/2007 |
|---|---|---|
| CN | 102596804 A | 7/2012 |

(Continued)

OTHER PUBLICATIONS

International Search Report in PCT/AT2021/060339, mailed Dec. 21, 2021.

(Continued)

*Primary Examiner* — Robert M Kunemund
(74) *Attorney, Agent, or Firm* — Collard & Roe, P.C.

(57) ABSTRACT

A device for producing single crystals of silicon carbide has a furnace and a chamber with a crucible and a seed crystal, the chamber being accommodated in the furnace, wherein a base material containing silicon carbide is arranged in the crucible, wherein the base material contains a mixture of silicon carbide powder and silicon carbide lumps.

12 Claims, 3 Drawing Sheets

(56) References Cited

U.S. PATENT DOCUMENTS

Figure 1:
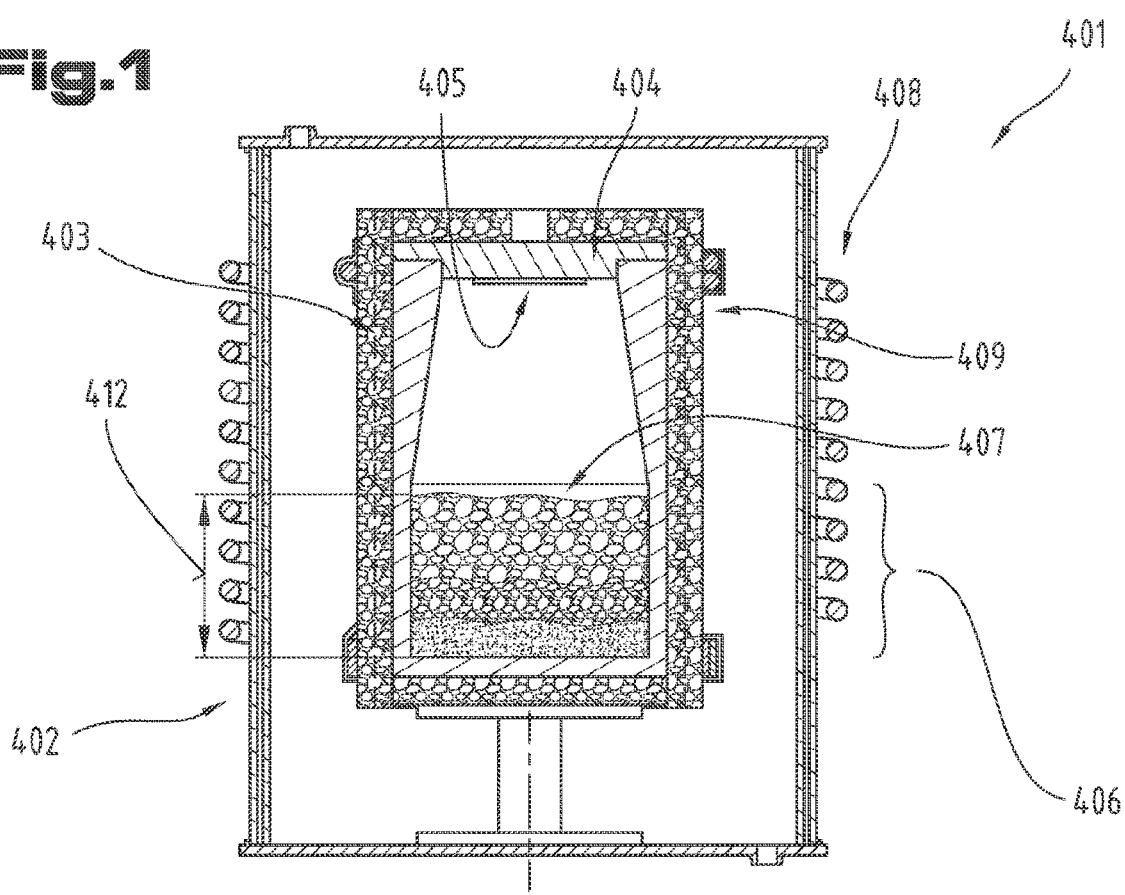

| | | |
|---|---|---|
| 9,816,200 B2 | 11/2017 | Masuda et al. |
| 11,078,599 B2 | 8/2021 | Jang et al. |
| 2003/0029376 A1 | 2/2003 | Snyder et al. |
| 2010/0024719 A1 | 2/2010 | Vanmil et al. |
| 2011/0226182 A1 | 9/2011 | Sasaki et al. |
| 2012/0000415 A1 | 1/2012 | D'Evelyn et al. |
| 2012/0285370 A1 | 11/2012 | Gupta et al. |
| 2013/0157442 A1 | 6/2013 | Bondokov et al. |
| 2013/0174784 A1 | 7/2013 | Kondo |
| 2013/0327265 A1* | 12/2013 | Inoue ............... C30B 23/02 117/84 |
| 2014/0352607 A1 | 12/2014 | Kim et al. |
| 2014/0363607 A1 | 12/2014 | Sato et al. |
| 2016/0002820 A1 | 1/2016 | Hori et al. |
| 2016/0160386 A1* | 6/2016 | Masuda ............... C01B 32/97 428/402 |
| 2017/0145591 A1 | 5/2017 | Yoshida |
| 2018/0057925 A1 | 3/2018 | Ma et al. |
| 2018/0066380 A1 | 3/2018 | Tani et al. |
| 2018/0290893 A1 | 10/2018 | Dukes et al. |
| 2020/0123678 A1 | 4/2020 | Ko et al. |
| 2020/0149190 A1 | 5/2020 | Fujikawa |
| 2020/0199777 A1 | 6/2020 | Drachev et al. |
| 2020/0354856 A1 | 11/2020 | Gao et al. |
| 2022/0010457 A1 | 1/2022 | Ebner et al. |

FOREIGN PATENT DOCUMENTS

| | | |
|---|---|---|
| CN | 103620095 A | 3/2014 |
| CN | 204982130 U | 1/2016 |
| CN | 105308223 A | 2/2016 |
| CN | 106894089 A | 6/2017 |
| CN | 108374197 A | 8/2018 |
| CN | 110016718 A | 7/2019 |
| CN | 110331438 A | 10/2019 |
| CN | 110541199 A | 12/2019 |
| CN | 110904509 A | 3/2020 |
| CN | 111074339 A | 4/2020 |
| CN | 110541199 B | 7/2020 |
| CN | 112663134 A | 4/2021 |
| DE | 3441707 A1 | 5/1986 |
| DE | 3448179 C2 | 10/1988 |
| DE | 102015212323 A1 | 1/2016 |
| DE | 102018129492 A1 | 5/2020 |
| EP | 3260582 A1 | 12/2017 |
| EP | 3666934 A1 | 6/2020 |
| JP | H11268989 A | 10/1999 |
| JP | 4061700 B2 | 3/2008 |
| JP | 2012066959 A | 4/2012 |
| JP | 2015168600 A | 9/2015 |
| JP | 2018118874 A | 8/2018 |
| JP | 6640680 B2 | 2/2020 |
| KR | 20130013709 A | 2/2013 |
| KR | 20130083654 A | 7/2013 |
| RU | 2633909 C1 | 10/2017 |
| TW | 539783 B | 7/2003 |
| TW | 201504488 A | 2/2015 |
| TW | 201522727 A | 6/2015 |
| TW | 201807272 A | 3/2018 |
| TW | 202018136 | 5/2020 |
| TW | 202028548 A | 8/2020 |
| WO | 0104390 A1 | 1/2001 |
| WO | 2012144872 A2 | 10/2012 |
| WO | 2013015630 A2 | 1/2013 |
| WO | 2015012954 A1 | 1/2015 |
| WO | 2018183585 A1 | 10/2018 |
| WO | 2019144804 A1 | 8/2019 |
| WO | 2020087723 A1 | 5/2020 |

OTHER PUBLICATIONS

International Search Report in PCT/AT2021/060340, mailed Jan. 4, 2022.
International Search Report in PCT/AT2021/060341, mailed Dec. 21, 2021.
International Search Report in PCT/AT2021/060342, mailed Dec. 23, 2021.
International Search Report in PCT/AT2021/060343, mailed Dec. 10, 2021.
International Search Report in PCT/AT2021/060344, mailed Dec. 6, 2021.

* cited by examiner

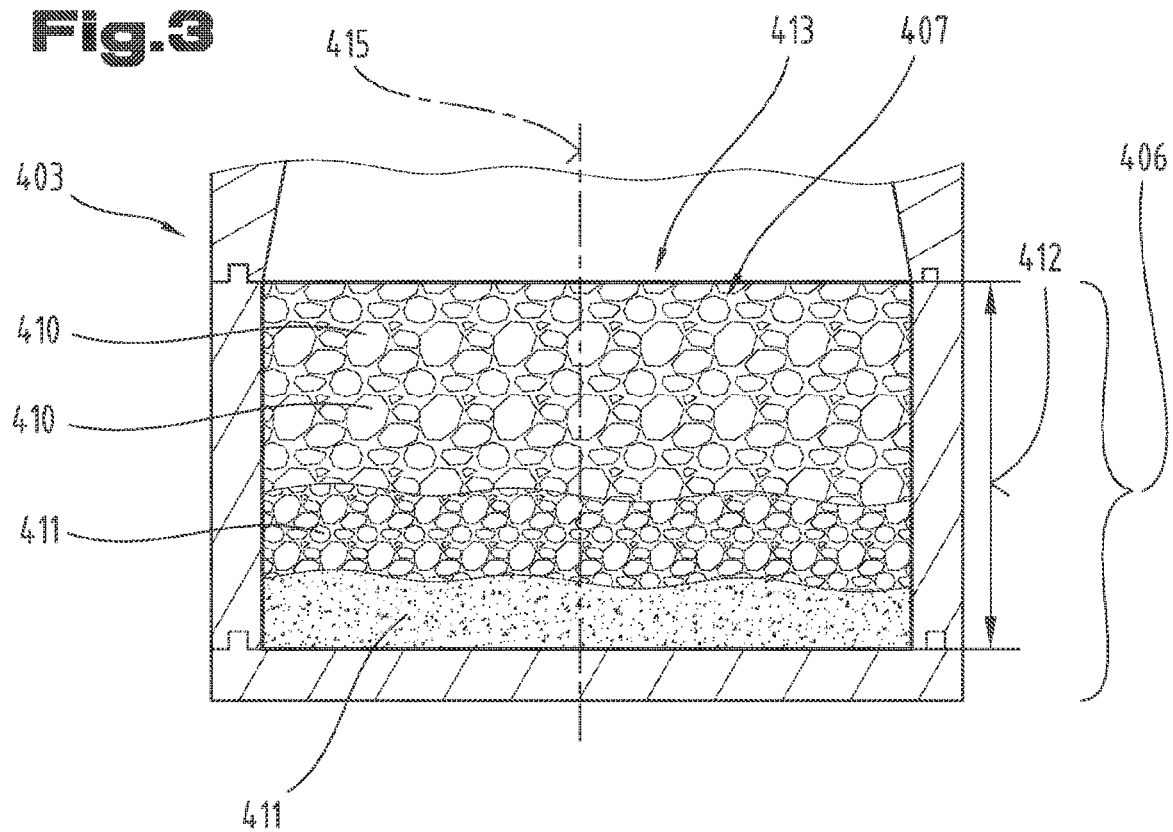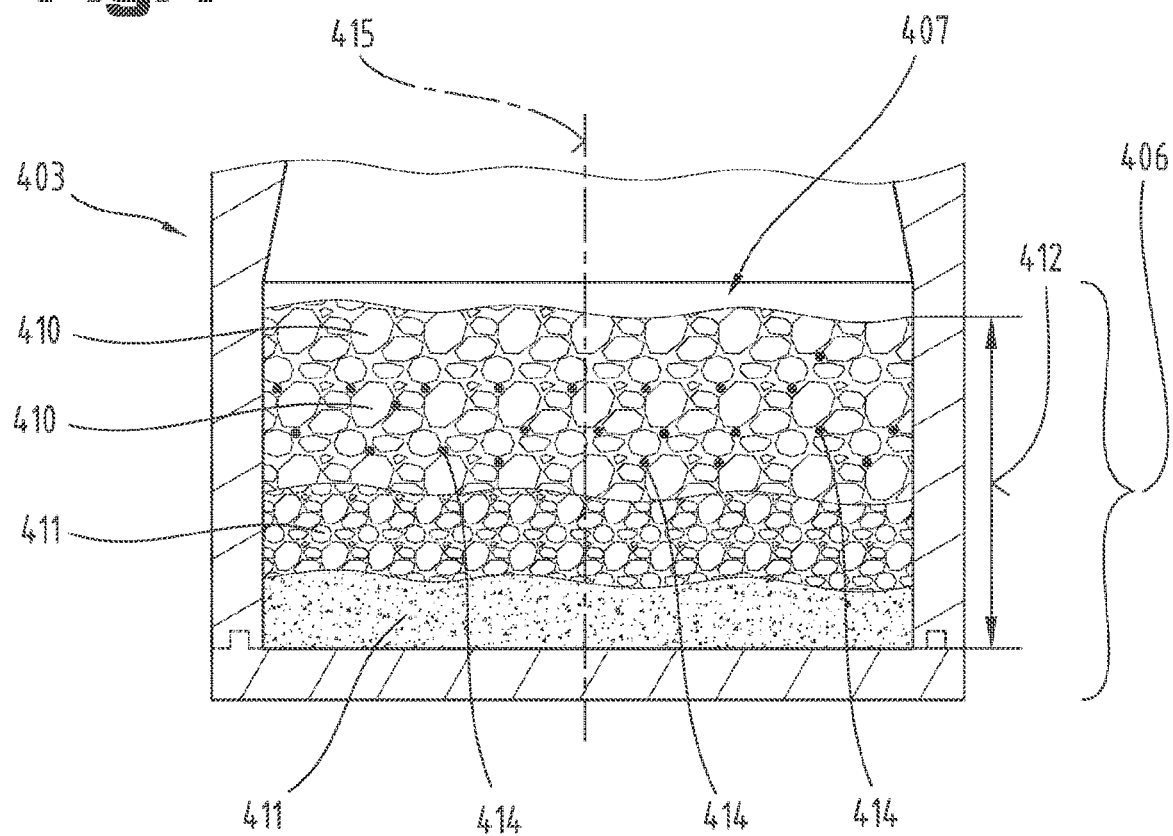

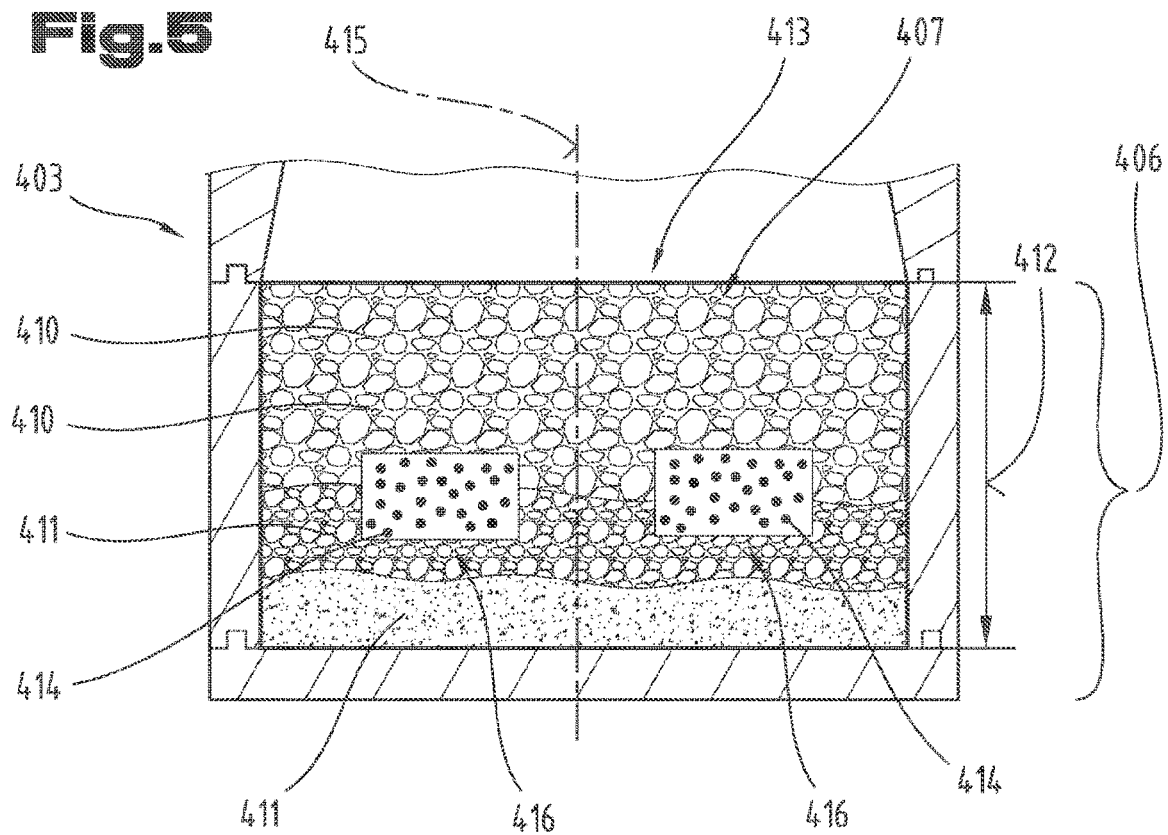
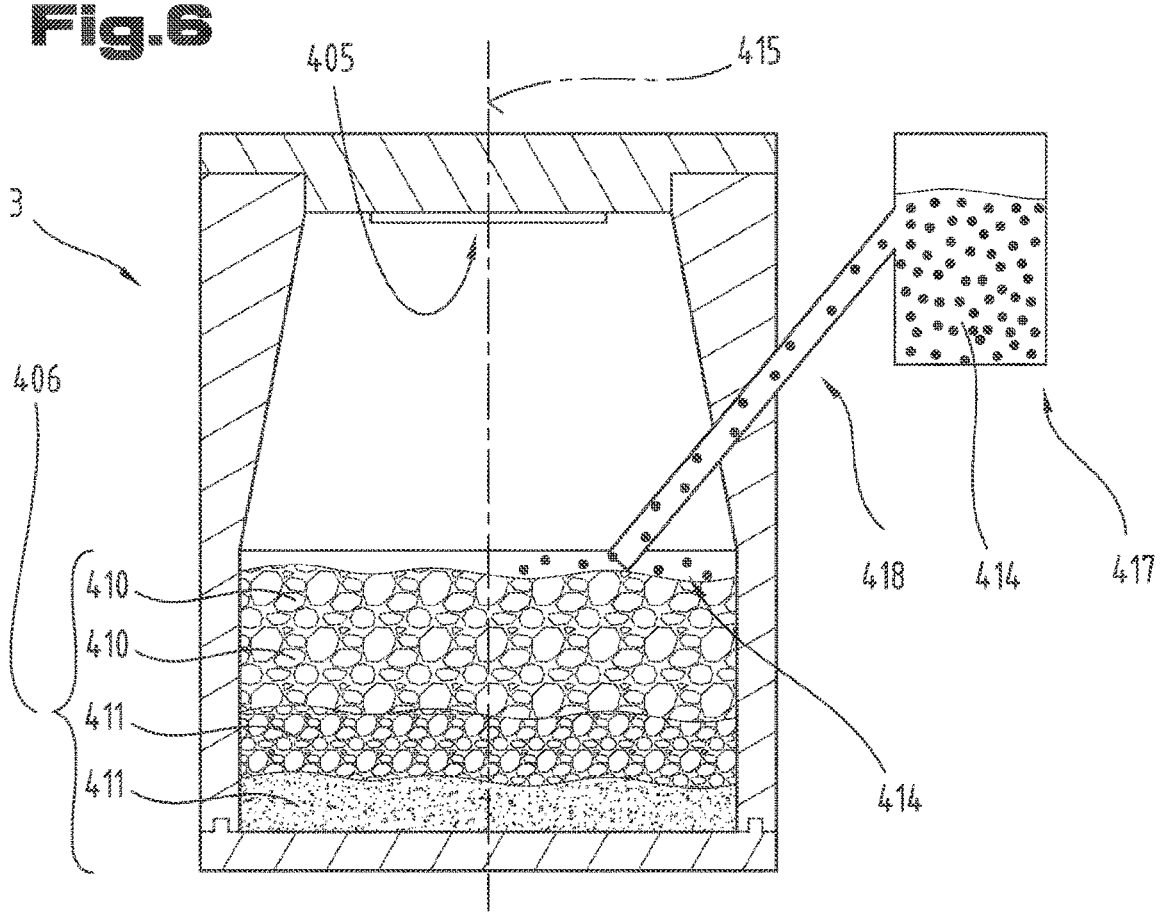

DEVICE FOR PRODUCING SILICON CARBIDE SINGLE CRYSTALS

CROSS REFERENCE TO RELATED APPLICATIONS

This application is the National Stage of PCT/AT2021/060341 filed on Sep. 23, 2021, which claims priority under 35 U.S.C. § 119 of Austrian Application No. A 50819/2020 filed on Sep. 28, 2020, the disclosure of which is incorporated by reference. The international application under PCT article 21(2) was not published in English.

The invention relates to a device and a method for producing single crystals of silicon carbide.

For many technical applications, single crystals are nowadays produced on an industrial scale. Based on the phase transitions leading to the crystal, a distinction can be made between the growth from the melt, from the solution and from the gas phase. In the case of growth from the gas phase, further distinctions can be made between the production methods of the sublimation and/or the physical vapor deposition and the method of the chemical vapor deposition. In the case of the physical vapor deposition, the substance to be grown is vaporized by means of heating, so that it transitions into the gas phase. Given suitable conditions, the gas can resublimate on a seed crystal, whereby a growth of the crystal takes place. The raw material (powder or granules) usually present in a polycrystalline form is thus recrystallized. The chemical vapor deposition works in a similar manner. In this process, the transition of the substance to be grown into the gas phase is only possible by means of an auxiliary substance, to which the substance chemically binds itself, since the vapor pressure would be too low otherwise. Thus, a higher transport rate towards the seed crystal is achieved in combination with the auxiliary substance.

A great interest is taken in silicon carbide single crystals, particularly because of their semiconductor properties. Their production is carried out in furnaces with a crucible, in which the silicon carbide raw material is heated, and a seed crystal, on which the further crystal growth takes place by means of accumulation. Moreover, the interior of the process chamber is evacuated. The material used for the innermost process chamber with the crucible is graphite. The state of the silicon carbide raw material is of great significance for the quality of the silicon carbide single crystal.

The object of the present invention was to overcome the disadvantages of the prior art and to provide a device, by means of which a production of single crystals of higher quality becomes possible.

This object is achieved by means of a device and a method according to the claims.

The device according to the invention for producing single crystals of silicon carbide is designed having a furnace and a chamber with a crucible and a seed crystal, the chamber being accommodated in the furnace, wherein a base material containing silicon carbide is arranged in the crucible, and wherein the base material contains a mixture of silicon carbide powder and silicon carbide lumps.

In this regard, it is advantageous if the silicon carbide lumps have a grain size with a value from a range of 1 mm to 10 mm, and if the silicon carbide powder has a grain size with a value from a range of 150 μm to 1000 μm.

According to an advantageous advancement of the device, it is provided that, based on a total mass, the base material contains silicon carbide powder and silicon carbide lumps in a mix ratio, which is selected from a range between 25 wt. % silicon carbide powder to 75 wt. % silicon carbide lumps and 55 wt. % silicon carbide powder to 45 wt. % silicon carbide lumps.

It is particularly advantageous if, based on the total mass, the base material contains silicon carbide powder and silicon carbide lumps in a mix ratio of 40 wt. % silicon carbide powder to 60 wt. % silicon carbide lumps.

It is also advantageous that the silicon carbide of the base material has a material purity of greater than 5 N.

According to a preferred embodiment, it is provided that the base material has different mix ratios of silicon carbide powder and silicon carbide lumps in different ranges of a height of the base material.

In this regard, it proves particularly advantageous if in a first, lower third of the height of the base material, silicon carbide powder and silicon carbide lumps are contained in a mix ratio selected from a range between 55% silicon carbide powder to 45% silicon carbide lumps and 70% silicon carbide powder to 30% silicon carbide lumps.

And further if in a second, middle third of the height of the base material, silicon carbide powder and silicon carbide lumps are contained in a mix ratio selected from a range between 40% silicon carbide powder to 60% silicon carbide lumps and 55% silicon carbide powder to 45% silicon carbide lumps.

It is also advantageous if in a third, upper third of the height of the base material, silicon carbide powder and silicon carbide lumps are contained in a mix ratio selected from a range between 25% silicon carbide powder to 75% silicon carbide lumps and 40% silicon carbide powder to 60% silicon carbide lumps.

According to an alternative advancement, it is provided that the base material is produced in the form of a pellet.

An embodiment, in which the base material contains elementary silicon in addition to the silicon carbide, in particular if the elementary silicon is contained in the form of silicon powder, is also advantageous.

A further advantageous advancement provides that the elementary silicon is formed into the base material in the form of one or multiple stores.

It is particularly preferred if the store with the elementary silicon is formed into a continuous ring.

It is particularly advantageous if the elementary silicon constitutes a proportion from a range of 5 wt. % to 50 wt. % of a total mass of the base material.

An alternative design of the device provides that a storage container for the powdery, elementary silicon and a feed line leading into the crucible are formed.

It is also advantageous if the crucible is made from graphite.

For the purpose of better understanding of the invention, it will be elucidated in more detail by means of the figures below.

Figure 2:
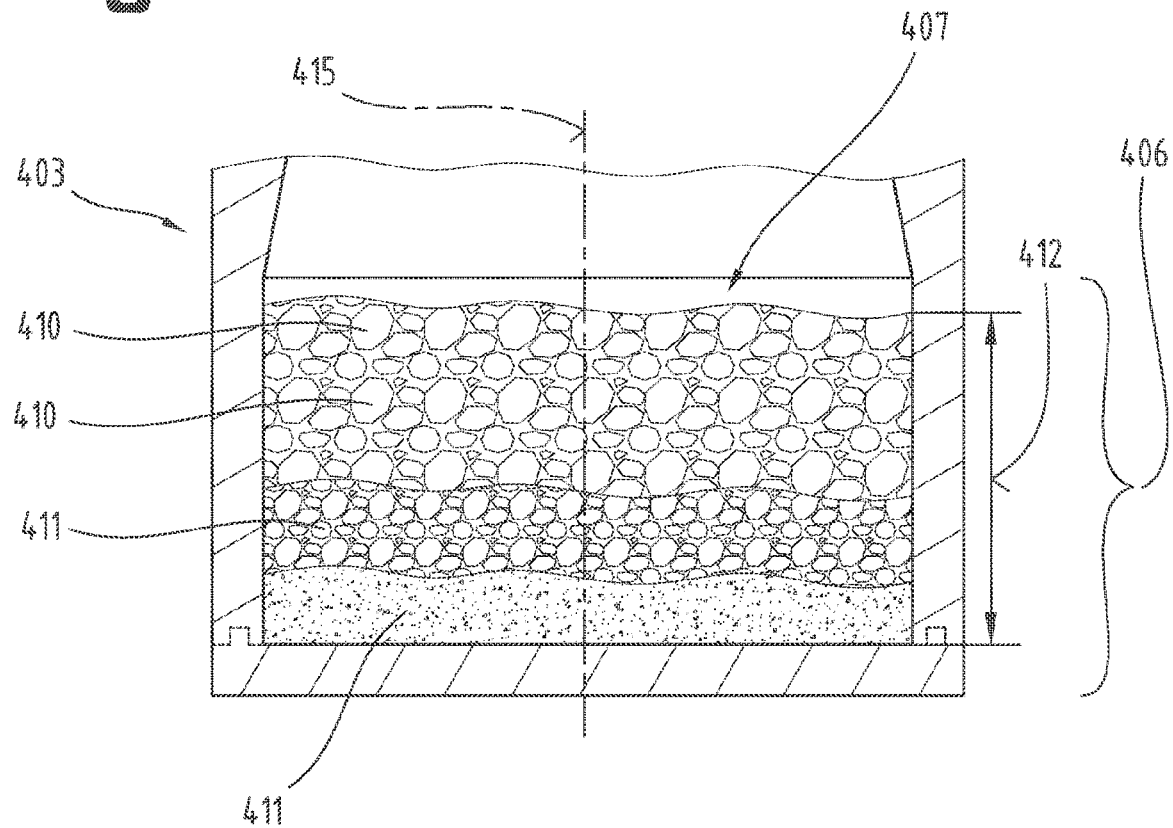

These show in a respectively very simplified schematic representation:

FIG. 1 a device for producing single crystals by means of physical vapor deposition;

FIG. 2 a detail of the crucible of the device according to FIG. 1;

FIG. 3 a second exemplary embodiment of the device for single crystal production, with a base material formed into a pellet;

FIG. 4 a third exemplary embodiment of the device for single crystal production;

FIG. 5 a fourth exemplary embodiment of the device for single crystal production;

FIG. 6 a fifth exemplary embodiment of the device for single crystal production.

First of all, it is to be noted that in the different embodiments described, equal parts are provided with equal reference numbers and/or equal component designations, where the disclosures contained in the entire description may be analogously transferred to equal parts with equal reference numbers and/or equal component designations. Moreover, the specifications of location, such as at the top, at the bottom, at the side, chosen in the description refer to the directly described and depicted figure and in case of a change of position, these specifications of location are to be analogously transferred to the new position.

FIG. 1 shows a furnace 401 for producing single crystals by means of physical vapor deposition. The furnace 401 comprises a chamber 402, which can be evacuated, with a crucible 403 accommodated therein. The crucible 403 is designed to be essentially pot-shaped, wherein an upper end region is closed by a cover 404. A bottom side of the cover 404 of the crucible 403 is, in this regard, configured to fasten a seed crystal 405. In a bottom region 406 of the crucible 403, a base material 407 is present, which serves as a raw material for the crystal growth on the seed crystal 405, and which is gradually consumed during the production process.

The transition of the base material 407 into the gas phase is achieved by heating with the aid of a heater 408. According to this exemplary embodiment, the heating of the base material 407 and the crucible 403 by means of the heater 408 is carried out inductively. The crucible 403 arranged in the chamber 402 is moreover enveloped by an insulation 409 for thermal insulation. By means of the insulation 409, thermal losses from the crucible 403 are simultaneously prevented, and a heat distribution favorable for the growth process of the crystal on the seed crystal 405 is achieved in the interior of the crucible 403.

The material for the chamber 402 is preferably a glass material, in particular a quartz glass. The crucible 403 and the insulation 409 surrounding it preferably consist of graphite, wherein the insulation 409 is formed by a graphite felt.

Because atoms and/or molecules of the base material 407 transition into the gas phase due to heating of the base material 407, the atoms and/or molecules can diffuse to the seed crystal 405 in the interior of the crucible 403 and accumulate thereon, whereby the crystal growth takes place. In this process, the formation of a single crystal being as free of impurities as possible is aimed for. The quality of the crystal forming on the seed crystal 405 depends on the temperature gradient between the base material 407 and the seed crystal 405 as well as on the vaporization rate of the base material 407. The latter, in turn, depends on the form in which the raw material of the base material 407 is provided in the crucible 403. In this regard, it proves advantageous if the base material 407 is formed by a mixture of a powdery raw material and a raw material present in the form of lumps.

FIG. 2 shows a detail of the crucible 403 of the furnace 401 according to FIG. 1. In this exemplary embodiment, silicon carbide is provided as the raw material for the base material 407. In this regard, the silicon carbide of the base material 407 comprises both lumps 410 and powder 411. The lumps 410 and the powder 411 of the silicon carbide are, in this regard, loosely layered in the bottom section 406 of the crucible 403. As adumbrated in the image according to FIG. 2, the powder 411 and the lumps 410 are present as a mixture. It proves advantageous here, if in different height ranges of the bottom section 406, the base material 407 is present in different mix ratios of lumps 410 and powder 411.

The duration of a production process of a single crystal of silicon carbide in the furnace 401 usually stretches over multiple days. In this regard, the consumption of the raw material of the base material 407 also depends on the temperature distribution created in the base material 407 by the heater 408, wherein the vaporization rate of the raw material may change accordingly over the duration of the process. This is because a gradual compacting due to superficial melting of the particles of the initially loosely distributed raw material of the base material 407 ensues. A different mix ratio of silicon carbide lumps 410 and silicon carbide powder 411 in the different filling regions and/or in the different height ranges of the bottom section 406 filled therewith may contribute to a vaporization rate that is as steady as possible during the correspondingly long duration of the entire crystallization process. The mix ratio of lumps 410 and powder 411 is significant insofar as powder 411 of the raw material is synonymous with a large surface and thus a great vaporization rate, and at the same time, lumps 410 having a smaller surface in total result in a lower vaporization rate.

In the exemplary embodiment according to FIG. 2, lumps 410 and powder 411 are layered up to a height 412 with different mix ratios. In this regard, the silicon carbide powder 411 is contained in a first, lower third of the height 412 of the base material 407 with a proportion of 55% to 70% of the weight. Correspondingly complementary to this, silicon carbide lumps 410 are contained in the lower third of the height 412 with a proportion of 30% to 45%. In a second, middle third of the height 412 of the base material 407, powder 411 is contained with a proportion of 40 wt. % to 55 wt. % and, with a correspondingly complementary proportion, lumps 410 are contained with 45 wt. % to 60 wt. %. In a third, upper third of the height 412 of the base material 407, finally, silicon carbide powder 411 is contained with a proportion of 25% to 40% and complementary to this, silicon carbide lumps 410 are contained with 60% to 75%.

The silicon carbide powder 411 has a grain size with a value from a range between 300 μm and 1000 μm. The silicon carbide lumps 410 have a grain size with a value from a range between 1 mm and 5 mm. In this regard, it is further provided that the silicon carbide is used having a great purity. For both the silicon carbide lumps 410 and the powder 411, a material purity of greater than 5 N is provided.

Based on the total mass of the overall base material 407 filled into the bottom region 406 of the crucible 403 at the beginning of the process, a mix ratio of silicon carbide powder 411 and silicon carbide lumps 410 is provided with 40 wt. % silicon carbide powder 411 to 60 wt. % silicon carbide lumps 410. However, mix ratios in a variation range of 25 wt. % silicon carbide powder 411 to 75 wt. % silicon carbide lumps 410 up to 55 wt. % silicon carbide powder 411 to 45 wt. % silicon carbide lumps 410 are also suitable.

FIG. 3 shows a second exemplary embodiment of the device for producing single crystals according to FIG. 1. In it, again, only a detail of the crucible 403 with the bottom section 406 is shown. The base material 407 of the mixture of the silicon carbide, which is filled into the bottom region 406 of the crucible 403, is formed by a pellet 413 in this case. The base material 407 of said pellet 413 also consists of a mixture of silicon carbide powder 411 and silicon carbide lumps 410. Just like in the exemplary embodiment according to FIG. 2, a variable distribution of the mix ratio of lumps 410 and powder 411 over the progression of the height 412 is provided. In order to produce a pellet 413, the silicon carbide lumps 410 and the silicon carbide powder 411 are pressed into a compact body in a preceding production process. It is also possible to carry out a heat treatment (a sintering process) of the silicon carbide mixture of the base material 407 to produce the pellet 413.

FIG. 4 shows a third exemplary embodiment of the device for producing single crystals according to FIG. 1. In this regard, the mixture of silicon carbide lumps 410 and silicon carbide powder 411 of the base material 407 additionally contains elementary silicon 414. Said silicon 414 is preferably mixed into the base material 407 in the form of fine-grained granules and/or as a powder, and also has a great material purity. The elementary silicon 414 preferably has a material purity of greater than 5 N. By adding the silicon 414 to the base material 407, a silicon deficiency developing in the silicon carbide mixture of the base material 407 over the duration of the crystallization process can be balanced out and/or compensated. In this exemplary embodiment, the elementary silicon 414 constitutes a weight proportion of the total mass of the base material 407 with a value from a range between 5 wt. % and 50 wt. %. This is preferably mixed into the base material 407 in the second, middle third and in the third, upper third of its height 412.

FIG. 5 shows a fourth exemplary embodiment of the furnace 401 with the crucible 403. The accommodation space of the crucible 403 in its bottom section 406 forms a volume, which is essentially rotationally symmetrical about an axis 415 and/or cylindrical. The base material 407 is moreover formed by a pellet 413 made of lumps 410 and powder 411 of silicon carbide. Additionally, stores 416 and/or reservoirs with elementary silicon 414 are formed into and/or enclosed in the volume of the pellet 413. The stores 416 in the pellet 413 preferably contain powdery silicon 414. The quantity of the silicon 414 added to the pellet 413 is preferably enclosed in the same in the form of an annularly connected store 416. The volume of the silicon 414 may be stored in the pellet 413 of the base material 407 for example in the form of a ring and/or a torus.

FIG. 6 shows a further, alternative exemplary embodiment of the device for producing single crystals of silicon carbide. In this regard, the image of the furnace 401 only shows its crucible 403 and additionally a storage container 417 for powdery and/or granular silicon 414. In the same way already described with the aid of FIG. 2, the base material 407 is initially formed by a mixture of lumps 410 and powder 411 of the silicon carbide in this exemplary embodiment, as well, and this mixture is loosely poured and/or layered in the bottom section 406 of the crucible 403. Due to the arrangement of the storage container 417 with the elementary silicon 414, it is possible to supply elementary silicon 414 in addition to the silicon carbide to the base material 407 in different phases during the course of the crystallization process. For this purpose, a feed line 418 is provided between the storage container 417 arranged outside the crucible 403 and the interior of the crucible 403, by means of which feed line 418 the silicon 414 is conveyed. This may take place, for example, by means of a screw conveyor (not shown), which feeds the silicon 414 to the line 418 and/or conveys the silicon 414 through it.

The exemplary embodiments show possible embodiment variants, and it should be noted in this respect that the invention is not restricted to these particular illustrated embodiment variants of it, but that rather also various combinations of the individual embodiment variants are possible and that this possibility of variation owing to the technical teaching provided by the present invention lies within the ability of the person skilled in the art in this technical field.

The scope of protection is determined by the claims. Nevertheless, the description and drawings are to be used for construing the claims. Individual features or feature combinations from the different exemplary embodiments shown and described may represent independent inventive solutions. The object underlying the independent inventive solutions may be gathered from the description.

All indications regarding ranges of values in the present description are to be understood such that these also comprise random and all partial ranges from it, for example, the indication 1 to 10 is to be understood such that it comprises all partial ranges based on the lower limit 1 and the upper limit 10, i.e. all partial ranges start with a lower limit of 1 or larger and end with an upper limit of 10 or less, for example 1 through 1.7, or 3.2 through 8.1, or 5.5 through 10.

Finally, as a matter of form, it should be noted that for ease of understanding of the structure, elements are partially not depicted to scale and/or are enlarged and/or are reduced in size.

LIST OF REFERENCE NUMBERS

401 Furnace
402 Chamber
403 Crucible
404 Cover
405 Seed crystal
406 Bottom section
407 Base material
408 Heater
409 Insulation
410 Lumps
411 Powder
412 Height
413 Pellet
414 Silicon
415 Axis
416 Bearing
417 Storage container
418 Feed line

The invention claimed is:

1. A method for producing single crystals of silicon carbide with a device comprising a furnace (401) and a chamber (402) with a crucible (403), the chamber (402) being accommodated in the furnace (401), wherein a seed crystal and a base material (407) containing silicon carbide is arranged in the crucible (403), wherein the base material (407) contains a mixture of silicon carbide powder (411) and silicon carbide lumps (410), wherein the silicon carbide powder (411) has a grain size with a value from a range of 300 μm to 1000 μm
and the silicon carbide lumps (410) have a grain size with a value from a range of 1 mm to 10 mm,
and wherein in a first, lower third of the height (412) of the base material (407), silicon carbide powder (411) and silicon carbide lumps (410) are contained in a mix ratio selected from a range between 55% silicon carbide powder (411) to 45% silicon carbide lumps (410) and 70% silicon carbide powder (411) to 30% silicon carbide lumps (410),
and in a second, middle third of the height (412) of the base material (407), silicon carbide powder (411) and silicon carbide lumps (410) are contained in a mix ratio selected from a range between 40% silicon carbide powder (411) to 60% silicon carbide lumps (410) and 55% silicon carbide powder (411) to 45% silicon carbide lumps (410), and in a third, upper third of the height (412) of the base material (407), silicon carbide powder (411) and silicon carbide lumps (410) are contained in a mix ratio selected from a range between 25% silicon carbide powder (411) to 75% silicon carbide lumps (410) and 40% silicon carbide powder (411) to 60% silicon carbide lumps (410).

2. The method according to claim 1, wherein, based on a total mass, the base material (407) contains silicon carbide powder (411) and silicon carbide lumps (410) in a mix ratio, which is selected from a range between 25 wt. % silicon carbide powder (411) to 75 wt. % silicon carbide lumps (410) and 55 wt. % silicon carbide powder (411) to 45 wt. % silicon carbide lumps (410).

3. The method according to claim 2, wherein, based on the total mass, the base material (407) contains silicon carbide powder (411) and silicon carbide lumps (410) in a mix ratio of 40 wt. % silicon carbide powder (411) to 60 wt. % silicon carbide lumps (410).

4. The method according to claim 1, wherein the silicon carbide (410, 411) of the base material (407) has a material purity of greater than 5 N.

5. The method according to claim 1, wherein the base material (407) is produced in the form of a pellet (413).

6. The method according to claim 1, wherein elementary silicon (414) is in addition to the silicon carbide added to the base material (407).

7. The method according to claim 6, wherein the elementary silicon (414) is contained in the form of silicon powder (411).

8. The method according to claim 6, wherein the elementary silicon (414) is formed into the base material (407) in the form of one or multiple stores.

9. The method according to claim 6, wherein the store with the elementary silicon (414) is formed into a continuous ring.

10. The method according to claim 6, wherein the elementary silicon (414) constitutes a proportion from a range of 5 wt. % to 50 wt. % of a total mass of the base material (407).

11. The method according to claim 6, wherein, for this purpose, a storage container (417) for the powdery, elementary silicon (414) and a feed line (418) leading into the crucible (403) are used.

12. The method according to claim 1, wherein the crucible (403) is made from graphite.

* * * * *